(12) United States Patent
Huang et al.

(10) Patent No.: US 6,993,259 B2
(45) Date of Patent: Jan. 31, 2006

(54) ELECTROMAGNETIC SIGNAL SENSING SYSTEM

(75) Inventors: Ming Chieh Huang, Taipei (CN); Wen Lie Liang, London (GB); Wen Tron Shay, Hsinchu (CN)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/936,799

(22) Filed: Sep. 9, 2004

(65) Prior Publication Data

US 2005/0141896 A1    Jun. 30, 2005

(30) Foreign Application Priority Data

Dec. 25, 2003  (TW)  .............................. 92136919 A

(51) Int. Cl.
*H04B 10/00* (2006.01)
*G02B 26/00* (2006.01)
*H01J 40/14* (2006.01)

(52) U.S. Cl. ...................... 398/115; 398/163; 359/237; 250/214 R

(58) Field of Classification Search ................ 359/237, 359/245; 398/115–118, 163; 250/214 R, 250/214.1, 208.1
See application file for complete search history.

(56) References Cited

U.S. PATENT DOCUMENTS

| 3,300,722 A | * | 1/1967 | Iizuka .......................... 398/115 |
| 3,470,378 A | * | 9/1969 | Mash et al. .............. 250/214 R |
| 4,552,151 A |   | 11/1985 | Bolomey et al. ............ 600/430 |
| 5,430,369 A |   | 7/1995 | Bolomey et al. .............. 324/95 |
| 6,777,659 B1 | * | 8/2004 | Schwarte ................. 250/208.1 |

* cited by examiner

*Primary Examiner*—Georgia Epps
*Assistant Examiner*—Jack Dinh
(74) *Attorney, Agent, or Firm*—Volentine Francos & Whitt, PLLC

(57) ABSTRACT

The present electromagnetic signal sensing system includes a modulating circuit for generating an electrical modulating signal, a laser electrically connected to the modulating circuit, an optically modulated scatterer coupled with the laser, a receiving antenna, a synchronous detection circuit electrically connected to the receiving antenna and a signal processing circuit electrically connected to the synchronous detection circuit. The laser generates an optical modulating signal based on the electrical modulating signal for modulating the optically modulated scatterer to generate a modulated scattering signal. The receiving antenna receives the modulated scattering signal, the synchronous detection circuit generates an in-phase signal and a quadrature-phase signal with a phase offset of 90 degrees from the electrical modulating signal, and the signal processing circuit calculates the amplitude and phase of the electromagnetic signal from the in-phase signal and the quadrature-phase signal.

22 Claims, 12 Drawing Sheets

ELECTROMAGNETIC SIGNAL SENSING SYSTEM

BACKGROUND OF THE INVENTION (A) Field of the Invention

The present invention relates to an electromagnetic signal sensing system, and more particularly, to an electromagnetic signal sensing system without interfering with the electromagnetic signal to be measured.

(B) Description of the Related Art

Since a wireless communication system uses an antenna to transmit and receive an electromagnetic signal, how to make the electromagnetic field emitted by the antenna comply with the specifications is an important subject for improving the antenna quality. In addition, the intensity of the electromagnetic wave emitted by the wireless communication product must be lower than the specific absorption rate (SAR) specified by the international safety standard to come into the market, therefore the SAR measurement technique is very important for the development of the cell phone. Presently, there are many electromagnetic wave measurement techniques; one of them utilizes the modulated scatterer to measure the distribution of the electromagnetic field.

U.S. Pat. No. 4,552,151 and U.S. Pat. No. 5,430,369 disclose a modulated scatterer array, which utilizes an electrical signal to modulate a diode inside the scatterer and incorporates with the fast scan to measure the electromagnetic field. The technique disclosed by the above-described patents applies the bias voltage to the diode inside the scatterer through a conductive wire. The conductive wire used for transmitting the electrical modulating signal will irradiate the electromagnetic wave, which however interferes with the electromagnetic signal to be measured. Briefly, the measurement accuracy of the electromagnetic signal is affected since the prior art uses the conductive wire to transmit the electrical modulating signal and electronically applies bias voltage to the diode inside the scatterer.

SUMMARY OF THE INVENTION

The objective of the present invention is to provide an electromagnetic sensing system without interfering with the electromagnetic signal to be measured.

In order to achieve the above-mentioned objective, and avoid the problems of the prior art, the present electromagnetic signal sensing system comprises a modulating circuit for generating an electrical modulating signal, a laser electrically connected to the modulating circuit, an optically modulated scatterer coupled with the laser, a receiving antenna, a synchronous detection circuit electrically connected to the receiving antenna and a signal processing circuit electrically connected to the synchronous detection circuit.

The laser generates an optical modulating signal based on the electrical modulating signal for modulating the optically modulated scatterer to generate a modulated scattering signal. The receiving antenna receives the modulated scattering signal emitted from the optically modulated scatterer, the synchronous detection circuit generates an in-phase signal from the electrical modulating signal and a quadrature-phase signal from the receiving antenna with a 90-degree phase offset from the electrical modulating signal, and the signal processing circuit calculates the amplitude and phase of the electromagnetic signal from the in-phase signal and the quadrature-phase signal.

The optically modulated scatterer comprises a substrate, a scattering antenna including a first conductive line and a second conductive line positioned on the bottom surface of the substrate, an optical switch connecting the first conductive line and the second conductive line, and a optical waveguide for transmitting the optical modulating signal to the optical switch. The optical switch electrically connects the first conductive line and the second conductive line based on the optical modulating signal to form longer metallic scattering body so as to enhance the modulated scattering signal emitted from the optically modulated scatterer.

BRIEF DESCRIPTION OF THE DRAWINGS

Other objectives and advantages of the present invention will become apparent upon reading the following descriptions and upon reference to the accompanying drawings in which.

DETAILED DESCRIPTION OF THE INVENTION

Figure 1:
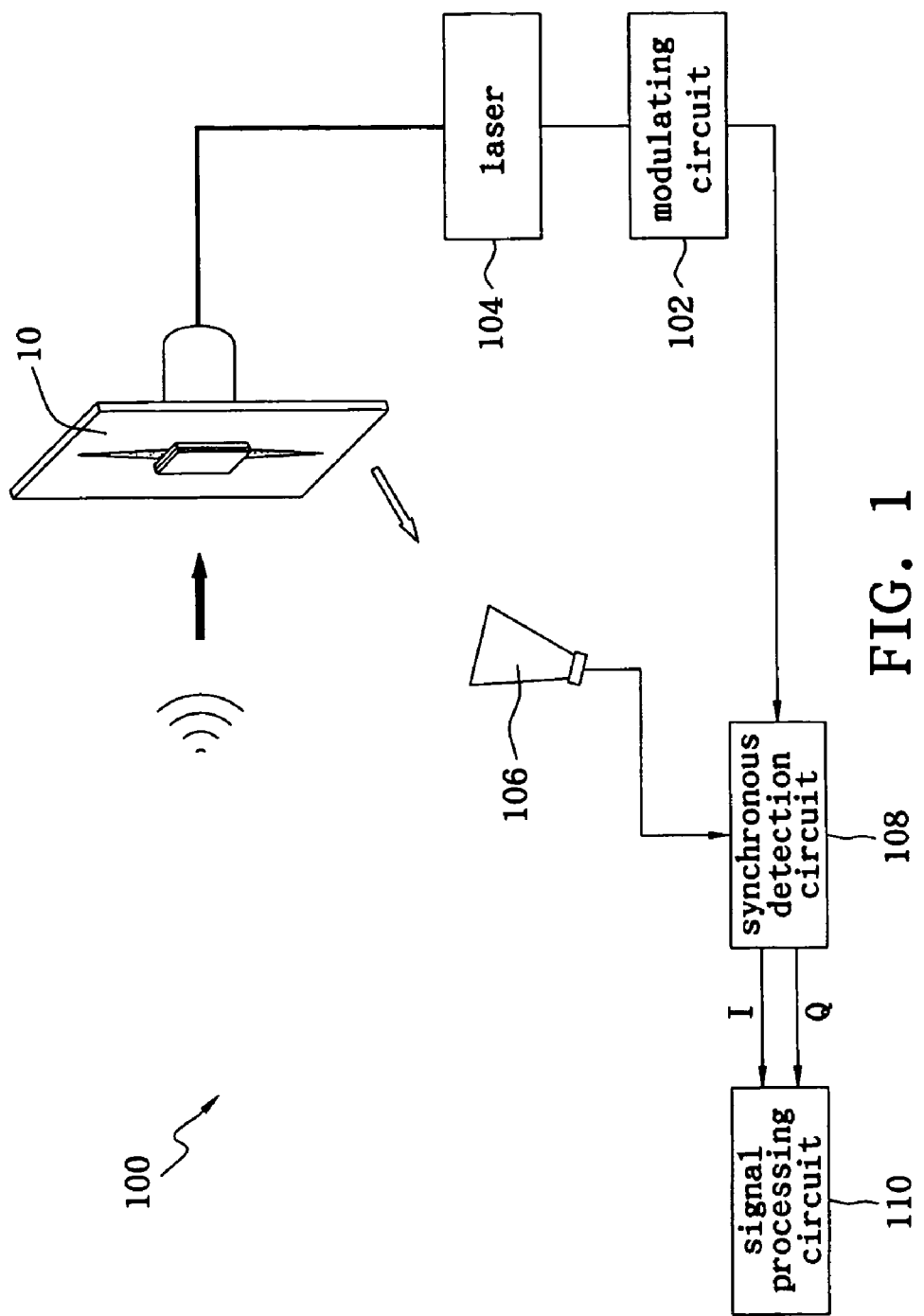
FIG. 1 illustrates an electromagnetic signal sensing system according to the first embodiment of the present invention.

FIG. 1 illustrates an electromagnetic signal sensing system 100 according to the first embodiment of the present invention. As shown in FIG. 1, the electromagnetic signal sensing system 100 comprises a modulating circuit 102 for generating an electrical modulating signal, a laser 104 electronically connected to the modulating circuit 102, an optically modulated scatterer 10 coupled with the laser 104, a receiving antenna 106, a synchronous detection circuit 108 electronically connected to the receiving antenna 106, and a signal processing circuit 110 electronically connected to the synchronous detection circuit 108.

The laser 104 generates an optical modulating signal based on the electrical modulating signal, while the optically modulated scatterer 10 can convert an electromagnetic signal into a modulated scattering signal based on the optical modulating signal. The modulated scattering signal is received by the receiving antenna 106 and transmitted to the synchronous circuit 108, and the synchronous detection circuit 108 generates an in-phase signal (I) and a quadrature-phase signal (Q) with 90-degree phase offset from the in-phase signal. The in-phase signal has the same phase as that of the electrical modulating signal, while the quadrature-phase signal has a 90-degree phase offset from the electrical modulating signal. The signal processing circuit 110 can calculate the amplitude and phase of the electromagnetic signal according to the in-phase signal and the quadrature-phase signal.

Figure 2:
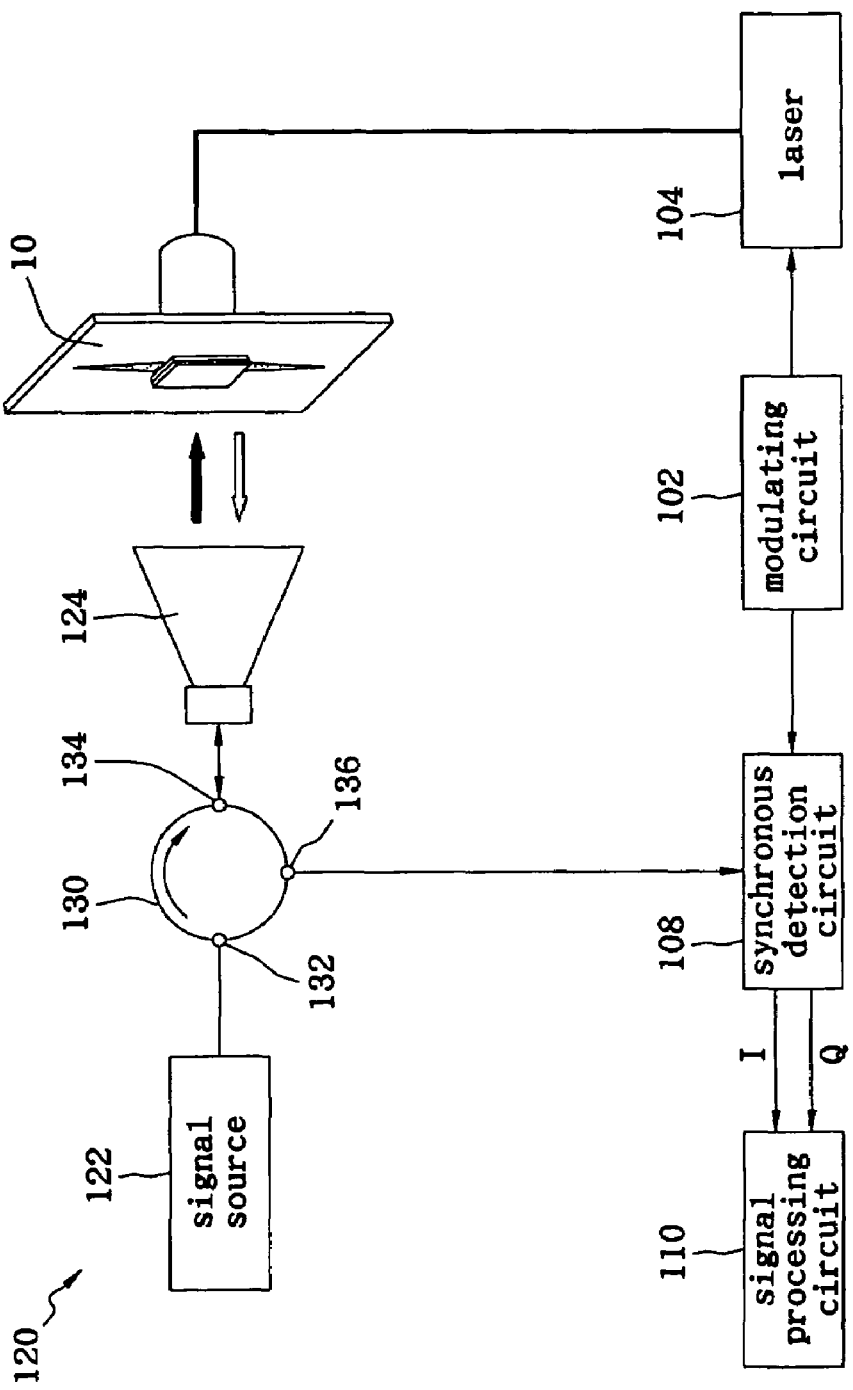
FIG. 2 illustrates an electromagnetic signal sensing system according to the second embodiment of the present invention.

FIG. 2 illustrates an electromagnetic signal sensing system 120 according to the second embodiment of the present invention. As shown in FIG. 2, the electromagnetic signal sensing system 120 comprises a signal generator 122 for generating a testing signal, a circulator 130 electronically connected to the signal generator 122, a transmitting/receiving antenna 124 electronically connected to the circulator 130, a modulating circuit 102 for generating an electrical modulating signal, a laser 104 electronically connected to the modulating circuit 102, a optically modulated scatterer 10 coupled with the laser 104, a synchronous detection circuit 108 electronically connected to the circulator 130 and a signal processing circuit 110 electronically connected to the synchronous detection circuit 108.

The circulator 130 includes a first port 132, a second port 134 and a third port 136, and the testing signal is input into the circulator 130 through the first port 132 and is output from the second port 134. The transmitting/receiving antenna 124 is electronically connected to the second port 134 of the circulator 130, and emits an electromagnetic signal based on the testing signal. The optically modulated scatterer 10 converts the electromagnetic signal into a modulated scattering signal, which is then received by the transmitting/receiving antenna 124 and input into the circulator 30 through the second port 134. The synchronous detection circuit 108 is electronically connected to the third port 136 of the circulator 130 and the modulated scattering signal from the transmitting/receiving antenna 124 is transmitted to the synchronous detection circuit 108 through the third port 136.

Figure 3:
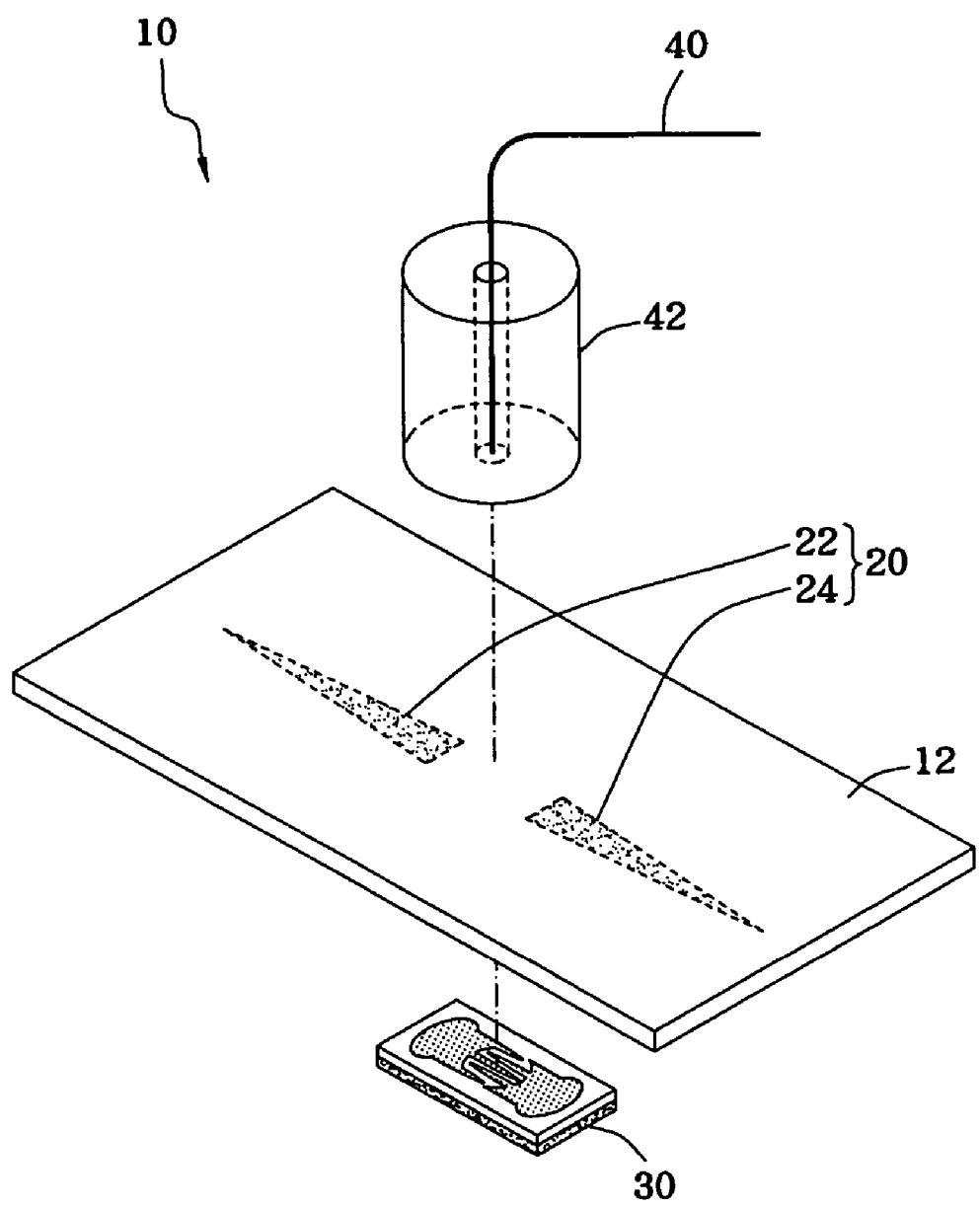
FIG. 3 illustrates an optically modulated scatterer according to the first embodiment of the present invention.

FIG. 3 illustrates an optically modulated scatterer 10 according to the first embodiment of the present invention. As shown in FIG. 3, the optically modulated scatterer 10 comprises a substrate 12, a scattering antenna 20 positioned on the bottom surface of the substrate 12, an optical switch 30 electrically connected to the scattering antenna 20, an optical waveguide 40 for transmitting the optical modulating signal and a sheath 42 for fixing the optical waveguide 40 on the upper surface of the substrate 12. The scattering antenna 20 includes a first conductive line 22 and a second conductive line 24 positioned on the bottom surface of the substrate 12. One end of the optical waveguide 40 points towards the optical switch 30, while the other end is coupled with the laser 104 (not shown in FIG. 3) to transmit the optical modulating signal to the optical switch 30.

Figure 4:
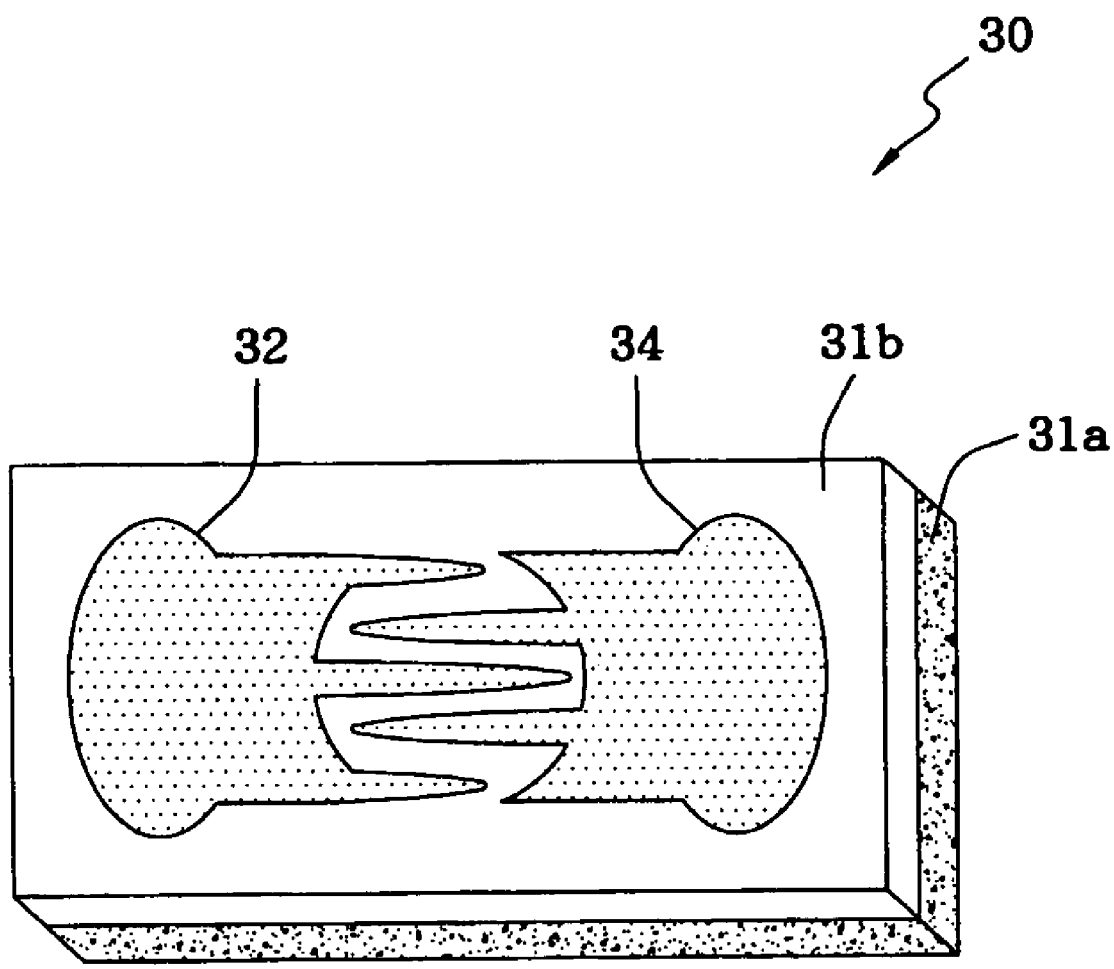
FIG. 4 is a schematic diagram of an optical switch according to the present invention.

FIG. 4 is a schematic diagram of the optical switch 30 according the present invention. As shown in FIG. 4, the optical switch 30 comprises an intrinsic GaAs (gallium arsenide) substrate 31a, a highly-doped GaAs substrate 31b, a first interdigital electrode 32 and a second interdigital electrode 34 positioned on the highly-doped GaAs substrate 31b. The first interdigital electrode 32 and the second interdigital electrode 34 are electrically connected to the first conductive line 22 and the second conductive line 24 of the scattering antenna 20, respectively. The optical waveguide 40 points towards the interdigital region between the first interdigital electrode 32 and the second interdigital electrode 34 of the optical switch 30. In addition, the highly-doped GaAs substrate 31b can be P-type or N-type, and forms an ohmic contact with the first interdigital electrode 32 and the second interdigital electrode 34.

When a light beam with appropriate energy irradiates the interdigital region of the optical switch 30, conductive electrons and holes are generated to reduce the resistance between the first interdigital electrode 32 and the second interdigital electrode 34 of the optical switch 30 so that the first interdigital electrode 32 and the second interdigital electrode 34 become conductive to couple the first conductive line 22 and the second conductive line 24 into a relatively longer metallic scattering body. In this way, the overall scattering cross-section is increased to enhance the modulated scattering signal emitted from the optically modulated scatterer 10, wherein the enhanced modulated scattering signal is in proportion (As the electromagnetic sensing system 100 shown in FIG. 1.) or in square proportion (As the electromagnetic sensing system 120 shown in FIG. 2.) to the electromagnetic field where the optically modulated scatterer 10 is positioned.

Figure 5:
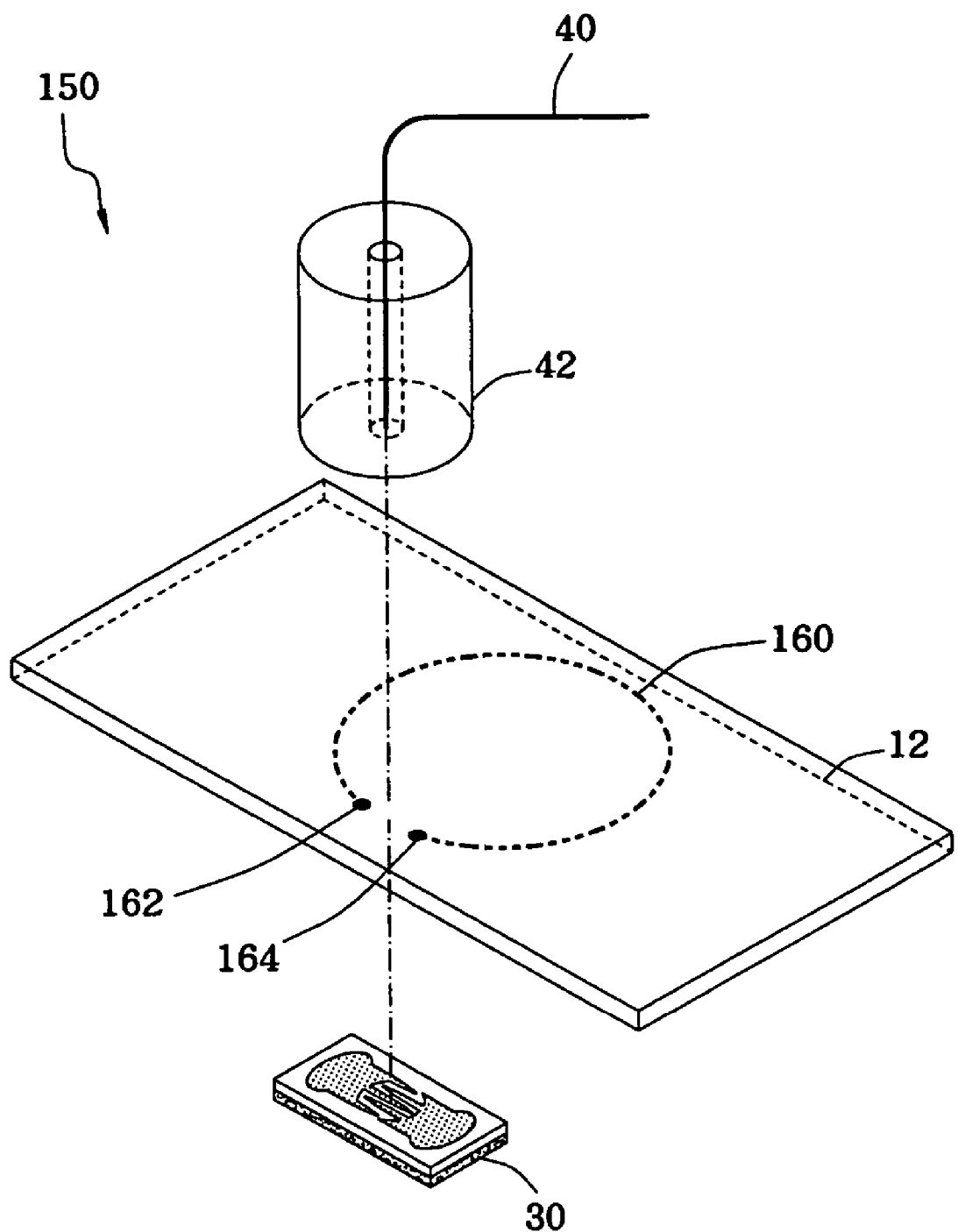
FIG. 5 illustrates an optically modulated scatterer according to the second embodiment of the present invention.

FIG. 5 illustrates an optically modulated scatterer 150 according the second embodiment of the present invention. Compared with the optically modulated scatterer 10 in FIG. 3, the optically modulated scatterer 150 in FIG. 5 uses a loop-shaped antenna 160 with two free ends 162, 164. When the optical switch 30 electronically connects the free ends 162 and 164, the loop-shaped antenna 160 can function to scatter a magnetic field to be measured.

Figure 6:
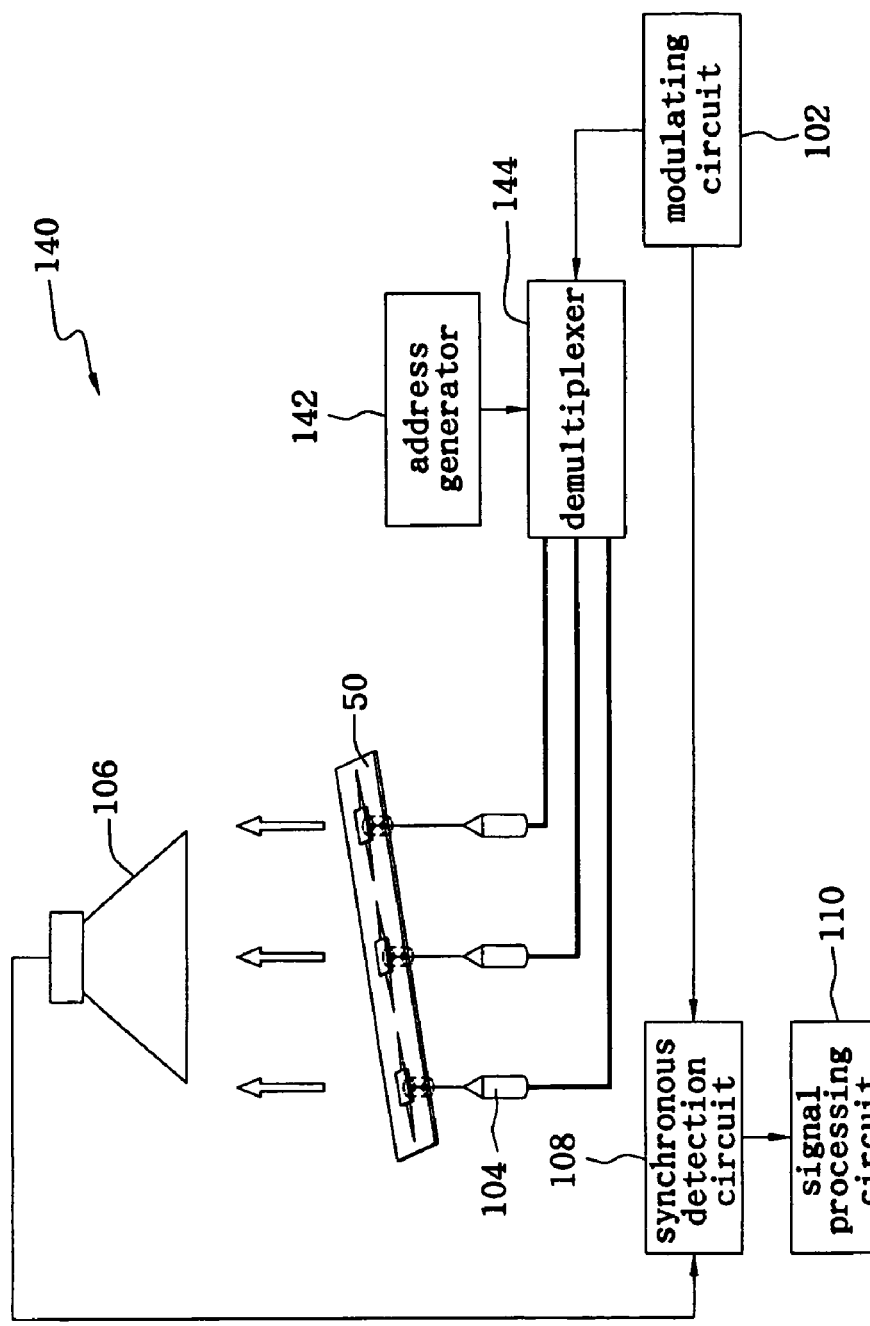
FIG. 6 illustrates an electromagnetic signal sensing system according to the third embodiment of the present invention.

FIG. 6 illustrates an electromagnetic signal sensing system 140 according to the third embodiment of the present invention. Compared with the electromagnetic signal sensing system 100 in FIG. 1, the electromagnetic signal sensing system 140 in FIG. 6 further includes an address generator 142 and a demultiplexer 144. In addition, the electromagnetic signal sensing system 140 uses an optically modulated scatterer array 50 and a plurality of lasers 104 to sense the distribution of the electromagnetic signal. The address generator 142 can generate an address signal (represent a certain laser 104), while the demultiplexer 144 enables the laser 104 represented by the address signal to generate the optical modulating signal, which modulates the optically modulated scatterer 10 coupled with the laser 104 to emit the modulated scattering signal. The modulated scattering signal is received by the receiving antenna 106, and then transmitted to the synchronous circuit 108 and the signal processing circuit 110. Through the address generator 142 and the demultiplexer 144 switching and controlling the plurality of scattering antennas 20, the electromagnetic signal sensing system 140 can measure the distribution of the electromagnetic field where the optically modulated scatterer array 50 is positioned.

Figure 7:
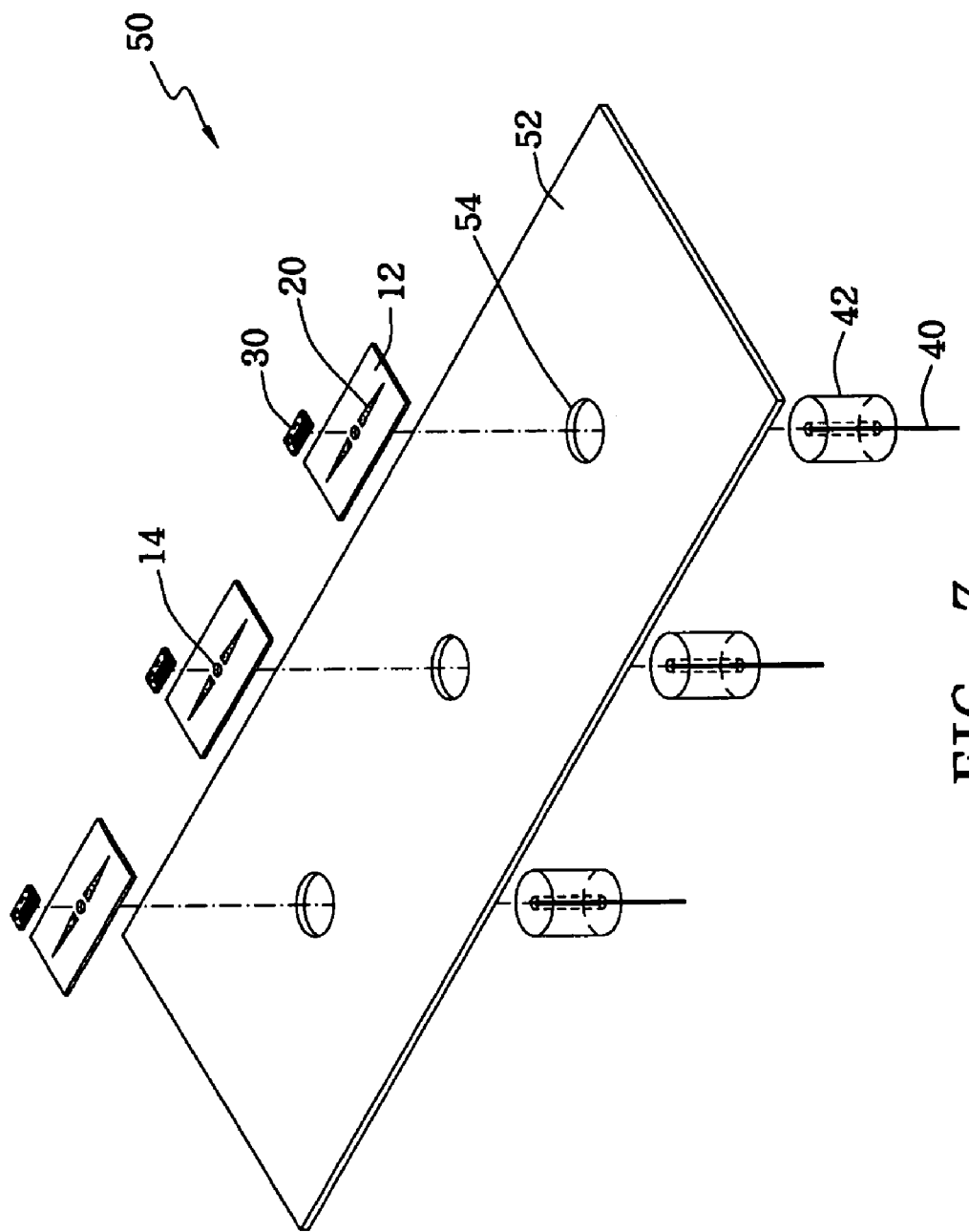
FIG. 7 illustrates an optically modulated scatterer array according to the first embodiment of the present invention.

FIG. 7 illustrates an optically modulated scatterer array 50 according to the first embodiment of the present invention. As shown in FIG. 7, the optically modulated scatterer array 50 comprises a substrate 52, a plurality of openings 54 positioned on the substrate 52 and a plurality of optically modulated scatterers 10. The diameter of the opening 54 is preferably slightly larger than the diameter of the sheath 42 so that the sheath 42 can be fixed on the substrate 52. The substrate 12 of the optically modulated scatterer 10 has an opening 14, and the optical waveguide 40 transmits the optical modulating signal to the optical switch 30 through the opening 14. The plurality of optically modulated scatterers 10 are positioned on the substrate 52 in a one-dimensional array manner, and can be used to measure the one-dimensional distribution of the electromagnetic field to be measured.

Figure 8:
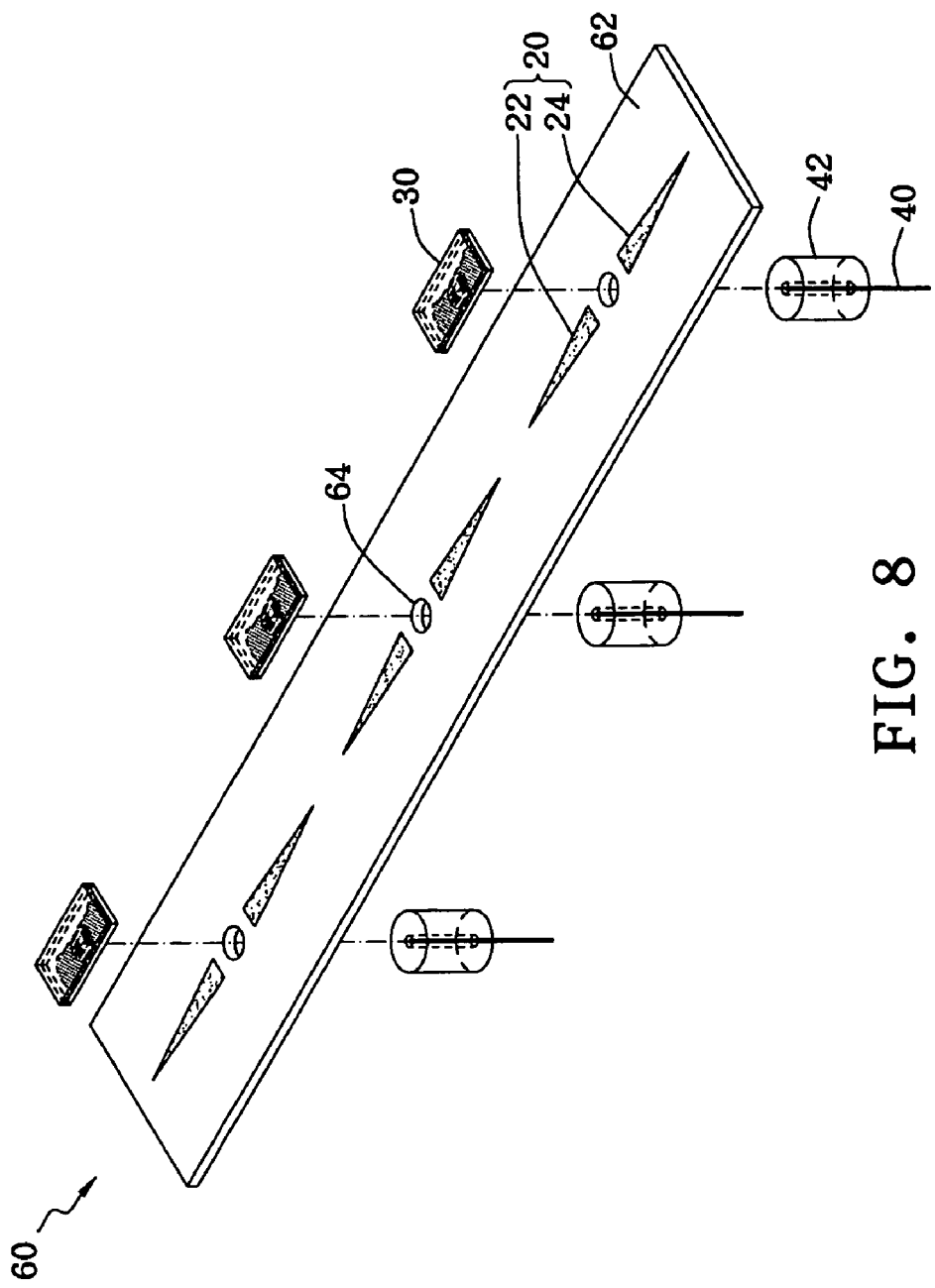
FIG. 8 illustrates an optically modulated scatterer array according to the second embodiment of the present invention.

FIG. 8 illustrates an optically modulated scatterer array 60 according to the second embodiment of the present invention. As shown in FIG. 8, the optically modulated scatterer array 60 comprises a substrate 62, a plurality of scattering antennas 20 positioned on the substrate 62, a plurality of optical switches 30 for controlling the scattering antenna 20 and a plurality of optical waveguides 40 for transmitting the optical modulating signal to the optical switch 30. The plurality of scattering antennas 20 constitutes a one-dimensional array, and can be used to measure the one-dimensional distribution of the electromagnetic field. There is an opening 64 between the first conductive line 22 and the second conductive line 24, and the optical waveguide 40 transmits the optical modulating signal to the optical switch 30 through the opening 64.

Figure 9:
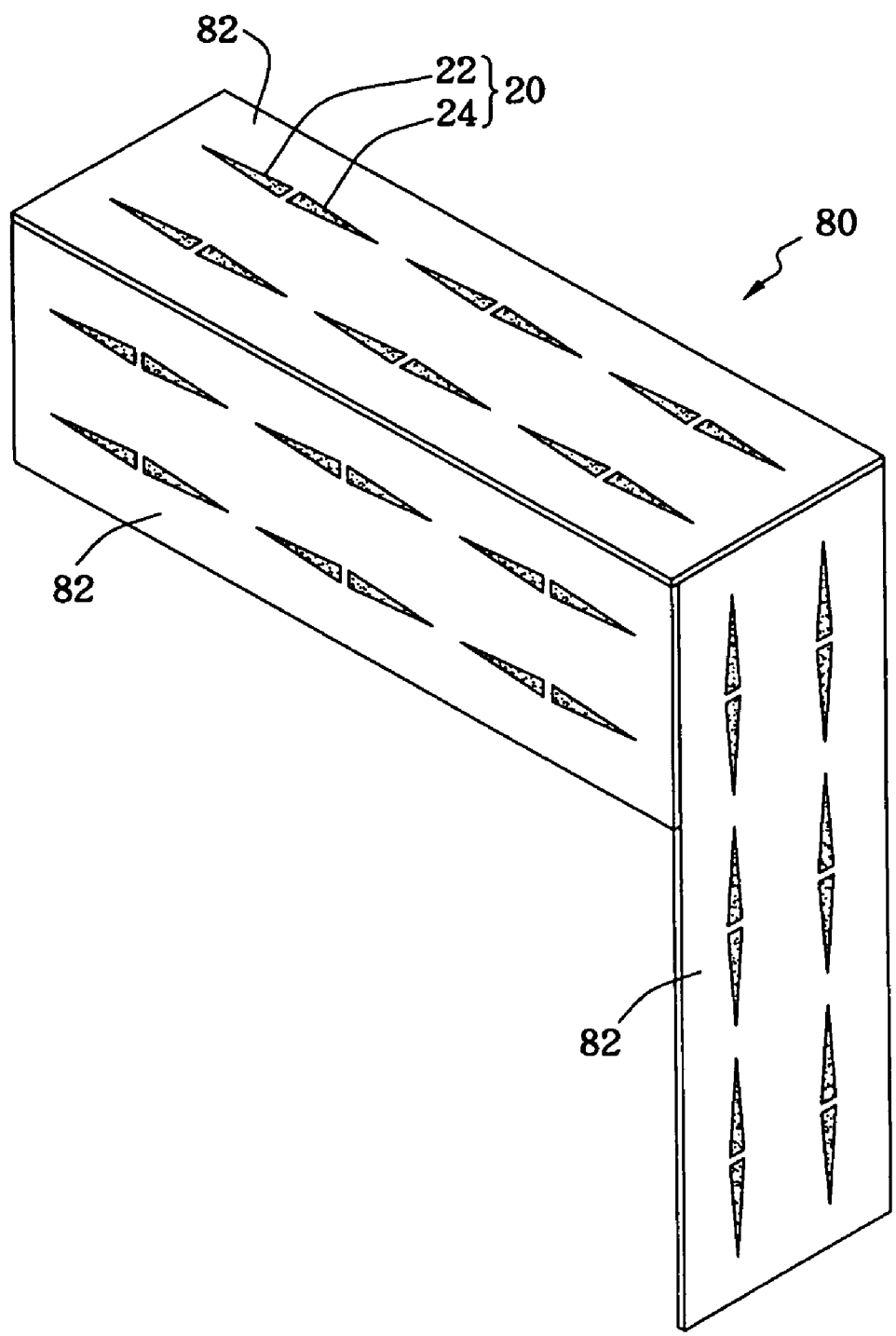
FIG. 9 illustrates an optically modulated scatterer array according to the third embodiment of the present invention.

FIG. 9 illustrates an optically modulated scatterer array 80 according to the third embodiment of the present invention, wherein only the scattering antenna 20 is shown for the sake of clarity and the optical switch 30 and the optical waveguide 40 corresponding to each scattering antenna 20 are not shown in the figure. As shown in FIG. 8, the optically modulated scatterer array 80 comprises three substrates 80 that are substantially perpendicular to each other, and each substrate 82 includes a plurality of scattering antennas 20 positioned in a two-dimensional array manner. The optically modulated scatterer array 80 can be used to measure the spatial distribution of the electromagnetic field.

Figure 10:
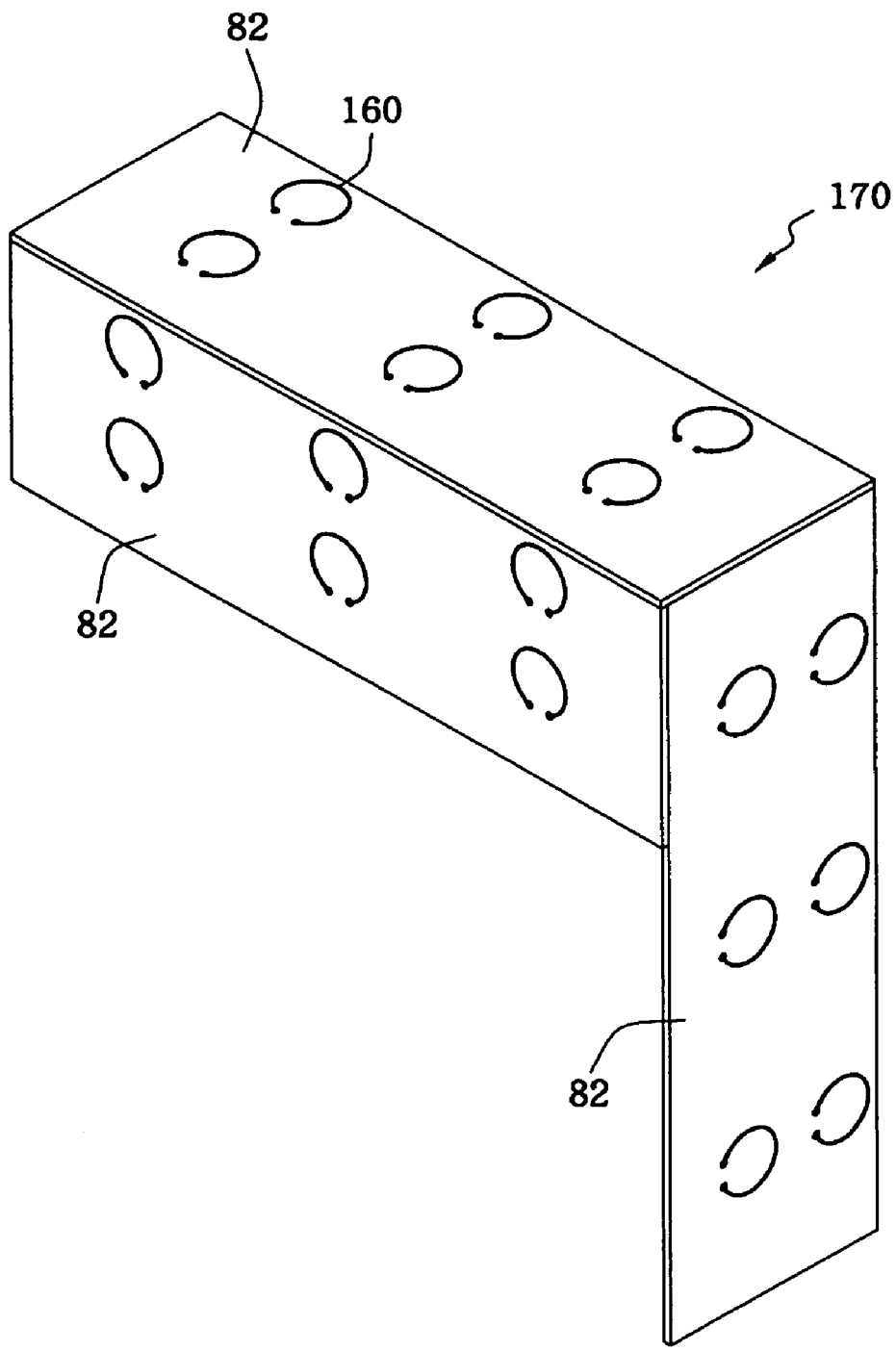
FIG. 10 illustrates an optically modulated scatterer array according to the fourth embodiment of the present invention.

FIG. 10 illustrates an optically modulated scatterer array 170 according to the fourth embodiment of the present invention. Compared with the optically modulated scatterer array 80 in FIG. 9, the optically modulated scatterer array 170 in FIG. 10 uses the loop-shaped antenna 160 rather than the scattering antenna 20. Through switching and controlling the optical switches 30 (not shown in FIG. 10) that connect the plurality of loop-shaped antennas 160, the optically modulated scatterer 170 can be used to measure the one-dimensional, two-dimensional or three-dimensional distribution of the electromagnetic field.

Figure 11:
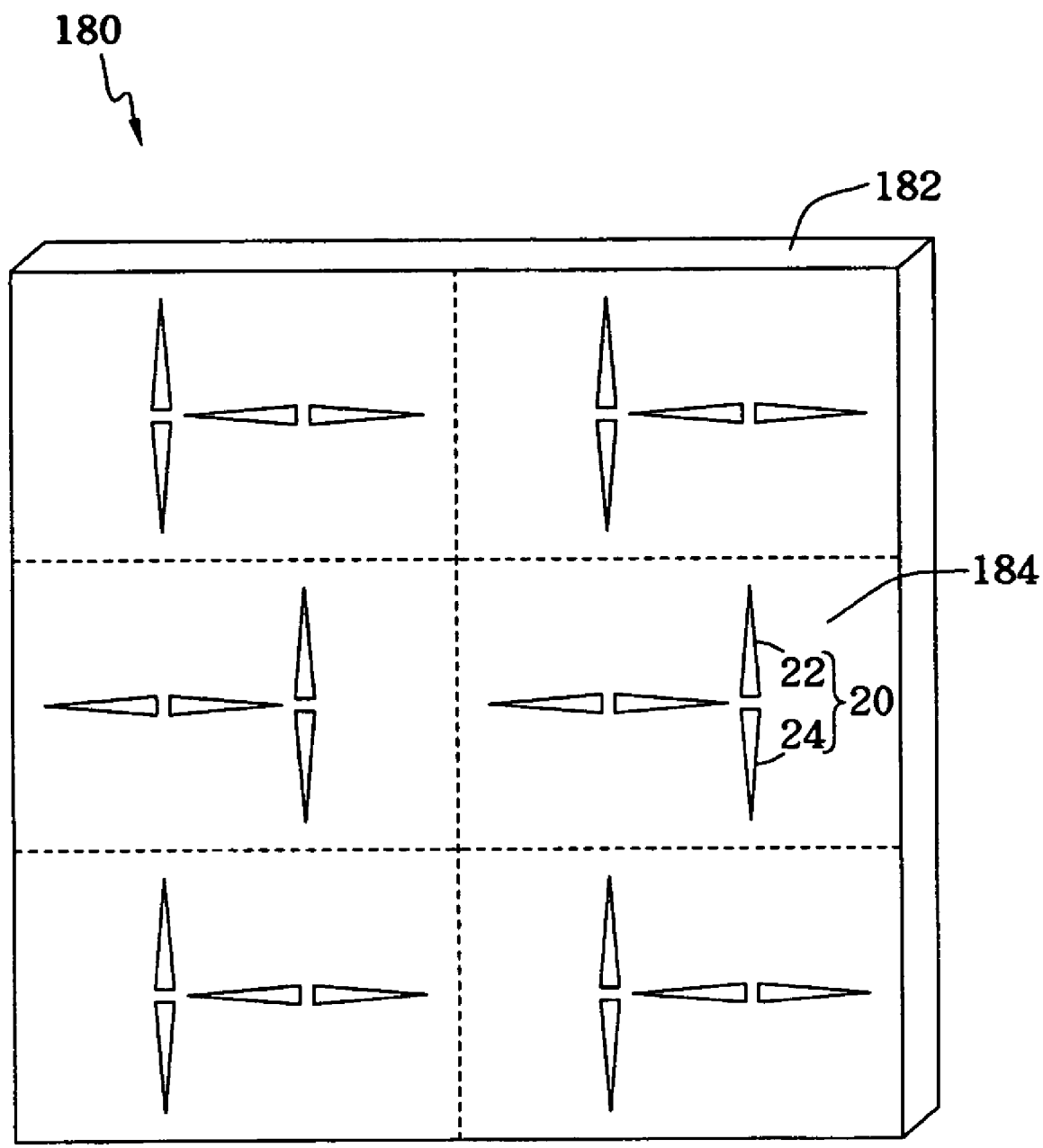
FIG. 11 illustrates an optically modulated scatterer array according to the fifth embodiment of the present invention.

FIG. 11 illustrates an optically modulated scatterer array 180 according to the fifth embodiment of the present invention, wherein only the scattering antenna 20 of each optically modulated scatterer 10 is shown for the sake of clarity, and the corresponding optical switch 30 and the optical waveguide 40 are not shown. As shown in FIG. 11, the optically modulated scatterer array 180 comprises a substrate 182, including a plurality of optical modulation scatterers 10 positioned in a two-dimensional array manner. The scattering antenna 20 of each optically modulated scatterer 10 is positioned on the substrate 182 in a perpendicular manner so as to measure the spatial distribution of the electromagnetic field. In the other words, the scattering antennas 20 can be grouped into a plurality of sets 184 with two scattering antennas 20 substantially perpendicular to each other, i.e., the optically modulated scatterers 10 are grouped into a plurality of sets 184 with two optically modulated scatterers 10 substantially perpendicular to each other.

Figure 12:
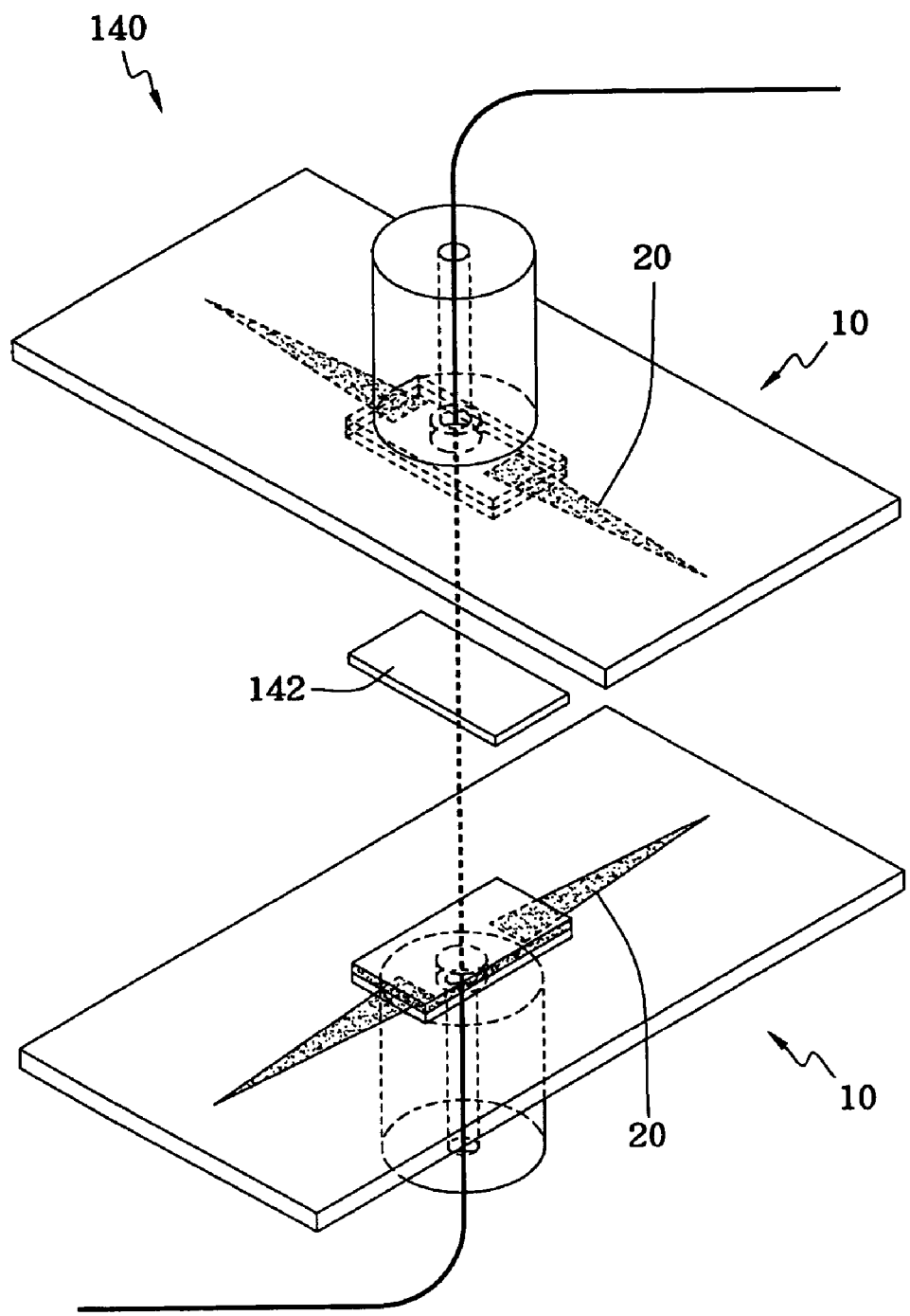
FIG. 12 illustrates an optically modulated scatterer array according to the sixth embodiment of the present invention.

FIG. 12 illustrates an optically modulated scatterer array 140 according to the seventh embodiment of the present invention. As shown in FIG. 12, the optically modulated scatterer array 140 comprises a substrate 142 and two optically modulated scatterers 10. The two optically modulated scatterers 10 are positioned on the upper and bottom surface of the substrate 142, respectively, and the two scattering antennas 20 are substantially perpendicular to each other for measuring the spatial distribution of the electromagnetic field.

Compared with the scatterer modulated directly by the electrical modulating signal according to the prior art, the optically modulated scatterer 10 of the present invention is modulated by the optical modulating signal, which will not interfere with the electromagnetic signal to be measured. The present invention changes the scattering cross-section of the scattering antenna 20 to emit the modulated scattering signal, and extracts the modulated scattering signal from the background noise of the electromagnetic field by the synchronous detection technique to measure the electromagnetic field where the optically modulated scatterer 10 is positioned. Furthermore, through the address generator 142 and the demultiplexer 144 switching and controlling the plurality of scattering antennas 20, and incorporated with the optically modulated scatterer array 60, the electromagnetic signal sensing system 140 can measure the electromagnetic field where the optically modulated scatterer array 60 is positioned.

The above-described embodiments of the present invention are intended to be illustrative only. Numerous alternative embodiments may be devised by those skilled in the art without departing from the scope of the following claims.

What is claimed is:

1. An electromagnetic signal sensing system, comprising:
   a modulating circuit for generating an electrical modulating signal;
   at least one laser for generating an optical modulating signal based on the electrical modulating signal;
   an optically modulated scattering device for converting an electromagnetic signal into a modulated scattering signal based on the optical modulating signal;
   a receiving antenna for receiving the modulated scattering signal;
   a detection circuit for detecting the electrical modulating signal and the modulated scattering signal; and
   a signal processing circuit electrically connected to the detection circuit for calculating the amplitude and phase of the electromagnetic signal.

2. The electromagnetic signal sensing system of claim 1, wherein the optically modulated scattering device comprises:
   a substrate;
   a scattering antenna, including a first conductive line and a second conductive line, positioned on the surface of the substrate;
   an optical switch connecting the first conductive line and the second conductive line; and
   an optical waveguide for transmitting the optical modulating signal to the optical switch.

3. The electromagnetic signal sensing system of claim 2, wherein the optical switch comprises:
   a GaAs substrate;
   a first interdigital electrode positioned on the GaAs substrate; and
   a second interdigital electrode positioned on the GaAs substrate, wherein the optical waveguide is aimed at an interdigital region between the first interdigital electrode and the second interdigital electrode.

4. The electromagnetic signal sensing system of claim 2, wherein the substrate further comprises an opening, and the waveguide transmits the optical modulating signal to the optical switch through the opening.

5. The electromagnetic signal sensing system of claim 1, further comprising:
   an address generator for generating an address signal; and
   a demultiplexer for enabling the laser to generate the optical modulating signal based on the address signal.

6. The electromagnetic signal sensing system of claim 5, wherein the optically modulated scattering device comprises:
   a second substrate; and
   a plurality of optically modulated scatterers positioned on the second substrate in an array manner, wherein the optically modulated scatterer comprises:
   a first substrate;
   a scattering antenna, including a first conductive line and a second conductive line, positioned on the surface of the first substrate;
   an optical switch connecting the first conductive line and the second conductive line; and
   an optical waveguide for transmitting the optical modulating signal to the optical switch.

7. The electromagnetic signal sensing system of claim 6, wherein the plurality of optically modulated scatterers are positioned on the second substrate, and grouped into a plurality of sets with two optically modulated scatterers substantially perpendicular to each other.

8. The electromagnetic signal sensing system of claim 6, wherein the optically modulated scattering device further comprises:
   a third substrate substantially perpendicular to the second substrate; and
   a plurality of optically modulated scatterers positioned on the third substrate in an array manner.

9. The electromagnetic signal sensing system of claim 5, wherein the optically modulated scattering device comprises:
   a first substrate; and
   a plurality of scattering antennas positioned on the first substrate in an array manner, wherein the scattering antenna includes a first conductive line and a second conductive line;
   a plurality of optical switches for connecting the first conductive line and the second conductive line; and
   a plurality of optical waveguides for transmitting the optical modulated signal to the optical switch.

10. The electromagnetic signal sensing system of claim 9, wherein the optically modulated scattering device further comprises:
    a second substrate substantially perpendicular to the first substrate; and
    a plurality of scattering antennas positioned on the second substrate in an array manner.

11. The electromagnetic signal sensing system of claim 9, wherein the plurality of scattering antennas are grouped into a plurality of sets with two scattering antennas substantially perpendicular to each other.

12. An electromagnetic signal sensing system, comprising:
    a signal generator for generating a testing signal;
    a circulator, including a first port, a second port and a third port, wherein the testing signal is input through the first port and output from the second port;
    an antenna electrically connected to the second port for emitting an electromagnetic signal based on the testing signal;
    a modulating circuit for generating an electrical modulating signal;
    at lease one laser for generating an optical modulating signal based on the electrical modulating signal;
    an optically modulated scattering device for converting the electromagnetic signal into a modulated scattering signal based on the optical modulating signal;
    a detection circuit for detecting the electrical modulating signal and the modulated scattering signal; and
    a signal processing circuit electrically connected to the detection circuit for calculating the amplitude and phase of the electromagnetic signal.

13. The electromagnetic signal sensing system of claim 12, wherein the detection circuit is electrically connected to the third port of the circulator, and the modulated scattering signal is received by the antenna and transmitted to the detection circuit through the circulator.

14. The electromagnetic signal sensing system of claim 12, wherein the optically modulated scattering device comprises:
    a substrate;
    a scattering antenna including a first conductive line and a second conductive line positioned on the surface of the substrate;
    an optical switch connecting the first conductive line and the second conductive line; and
    an optical waveguide for transmitting the optical modulating signal to the optical switch.

15. The electromagnetic signal sensing system of claim 14, wherein the optical switch comprises:
    a GaAs substrate;
    a first interdigital electrode positioned on the GaAs substrate; and
    a second interdigital electrode positioned on the GaAs substrate, wherein the optical waveguide is aimed at an interdigital region between the first interdigital electrode and the second interdigital electrode.

16. The electromagnetic signal sensing system of claim 12, further comprising:
    an address generator for generating an address signal; and
    a demultiplexer for enabling the laser to generate the optical modulating signal based on the address signal.

17. The electromagnetic signal sensing system of claim 16, wherein the optically modulated scattering device comprises:
    a second substrate; and
    a plurality of optically modulated scatterers positioned on the second substrate in an array manner, wherein the optically modulated scatterer includes:
    a first substrate;
    a scattering antenna, including a first conductive line and a second conductive line, positioned on the surface of the first substrate;
    an optical switch connecting the first conductive line and the second conductive line; and
    an optical waveguide for transmitting the optical modulating signal to the optical switch.

18. The electromagnetic signal sensing system of claim 17, wherein the plurality of optically modulated scatterers are positioned on the second substrate, and grouped into a plurality of sets with two optically modulated scatterers substantially perpendicular to each other.

19. The electromagnetic signal sensing system of claim 17, wherein the optically modulated scattering device further comprises:
    a third substrate substantially perpendicular to the second substrate; and a plurality of optically modulated scatterers positioned on the third substrate in an array manner.

20. The electromagnetic signal sensing system of claim 16, wherein the optically modulated scattering device comprises:
   a first substrate; and
   a plurality of scattering antennas positioned on the first substrate in an array manner, wherein the scattering antenna includes a first conductive line and a second conductive line;
   a plurality of optical switches for connecting the first conductive line and the second conductive line; and
   a plurality of optical waveguides for transmitting the optical modulated signal to the optical switch.

21. The electromagnetic signal sensing system of claim 20, wherein the optically modulated scattering device further comprises:
   a second substrate substantially perpendicular to the first substrate; and
   a plurality of scattering antennas positioned on the second substrate in an array manner.

22. The electromagnetic signal sensing system of claim 20, wherein the plurality of scattering antennas are grouped into a plurality of sets with two scattering antennas substantially perpendicular to each other.

* * * * *